United States Patent
Hsiao et al.

(10) Patent No.: US 8,098,486 B2
(45) Date of Patent: Jan. 17, 2012

(54) FLEXIBLE DISPLAY DEVICE

(75) Inventors: Po-Wen Hsiao, Hsinchu (TW);
Yuan-Chih Tsai, Hsinchu (TW);
Ted-Hong Shinn, Hsinchu (TW)

(73) Assignee: E Ink Holding Inc., Hsinchu (TW)

( * ) Notice: Subject to any disclaimer, the term of this patent is extended or adjusted under 35 U.S.C. 154(b) by 290 days.

(21) Appl. No.: 12/430,889

(22) Filed: Apr. 27, 2009

(65) Prior Publication Data

US 2010/0238612 A1 Sep. 23, 2010

(30) Foreign Application Priority Data

Mar. 18, 2009 (TW) .................... 98108836 A

(51) Int. Cl.
*H05K 7/14* (2006.01)
(52) U.S. Cl. ............... 361/679.21; 361/679.09; 349/153
(58) Field of Classification Search ............ 361/679.01, 361/679.09, 679.21, 679.26, 679.27, 679.56; 349/153, 160, 158, 156; 248/917–924
See application file for complete search history.

(56) References Cited

U.S. PATENT DOCUMENTS

| 6,104,464 | A  | * | 8/2000 | Adachi et al. ............... 349/150 |
| 7,710,370 | B2 | * | 5/2010 | Slikkerveer et al. ........... 345/85 |
| 7,868,545 | B2 | * | 1/2011 | Hioki et al. ................. 313/511 |
| 2008/0042940 | A1 | * | 2/2008 | Hasegawa .................. 345/76 |
| 2008/0055831 | A1 | * | 3/2008 | Satoh ....................... 361/681 |

* cited by examiner

*Primary Examiner* — Jinhee Lee
*Assistant Examiner* — Ingrid Wright
(74) *Attorney, Agent, or Firm* — Chun-Ming Shih

(57) ABSTRACT

A flexible display device includes a display panel and a plurality of curving-restricting structures. The display panel has a display surface and a bottom surface opposite thereto. The display surface has a visible region and an outer region surrounding the visible region. The curving-restricting structures may be disposed on at least one of the outer region of the display surface and the bottom surface of the display panel. Each curving-restricting structure has a top surface and at least a slanted side wall. The top surfaces of adjacent curving-restricting structures are spaced with each other, and the slanted side walls of adjacent curving-restricting structures face each other. When the flexible display device are curved to a predetermined extent, adjacent curving-restricting structures may resist against with each other to prevent the display panel from being unduly curved to be damaged, and thus a use reliability of the flexible display device is improved.

18 Claims, 5 Drawing Sheets

FLEXIBLE DISPLAY DEVICE

This application claims priority to a Taiwan application No. 098108836 filed Mar. 18, 2009.

BACKGROUND

1. Field of the Invention

The invention relates to a display device, and more particular, to a flexible display device.

2. Description of the Related Art

With progress of science and technology, display devices are used in any electric products popularly. Moreover, since the development trend of the portable electrical product is to achieve light weight and thin thickness, the flexible display device are researched.

Presently, most flexible display devices use thin film transistors (TFTs) array for controlling whether the pixels are acted or not. The thin film transistors array is generally made of several materials including the ceramic material with bad ductility. Thus, when the flexible display device is bent to over an extent the materials can bear, the thin film transistors array would be destroyed and the flexible display device may result in unusual displaying.

Therefore, it is one of the important issues for people skilled in this art that how to avoid the unusual displaying resulting from the flexible display device under over-bending.

BRIEF SUMMARY

The invention is directed to a flexible display device with improved use reliability.

The invention provides a flexible display device comprising a display panel and a plurality of first curving-restricting structures. The display panel has a display surface and a bottom surface opposite thereto. The display surface has a visible region and an outer region surrounding the visible region. The first curving-restricting structures are disposed in the outer region. Each first curving-restricting structure has a first top surface and at least a first slanted side wall. The first top surfaces of the adjacent first curving-restricting structures are separated to each other and the first slanted side walls thereof are faced to each other.

The invention also provides a flexible display device comprising a display panel and a plurality of curving-restricting structures. The display panel has a display surface with a visible region and an outer region surrounding the visible region and a bottom surface opposite thereto. The curving-restricting structures are disposed on the bottom surface and corresponded to the outer region of the display surface. Each curving-restricting structure has a top surface and at least a slanted side wall. The top surfaces of the adjacent first curving-restricting structures are separated to each other and the slanted side walls thereof face to each other.

For the flexible display device of the invention, since there are a plurality of curving-restricting structures disposed on the display panel, the adjacent curving-restricting structures can resist against with each other for restricting the bending angle of the display panel when the flexible display device is bent to a predetermined extent. Therefore, the internal elements of the display panel may avoid damages resulting from the display panel being over-bent, and thus the unusual displaying due to the over-bent display panel may be prevented and the use reliability of the flexible display device may be improved.

In order to make the aforementioned and other objects, features and advantages of the invention comprehensible, preferred embodiments accompanied with figures are described in detail below.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
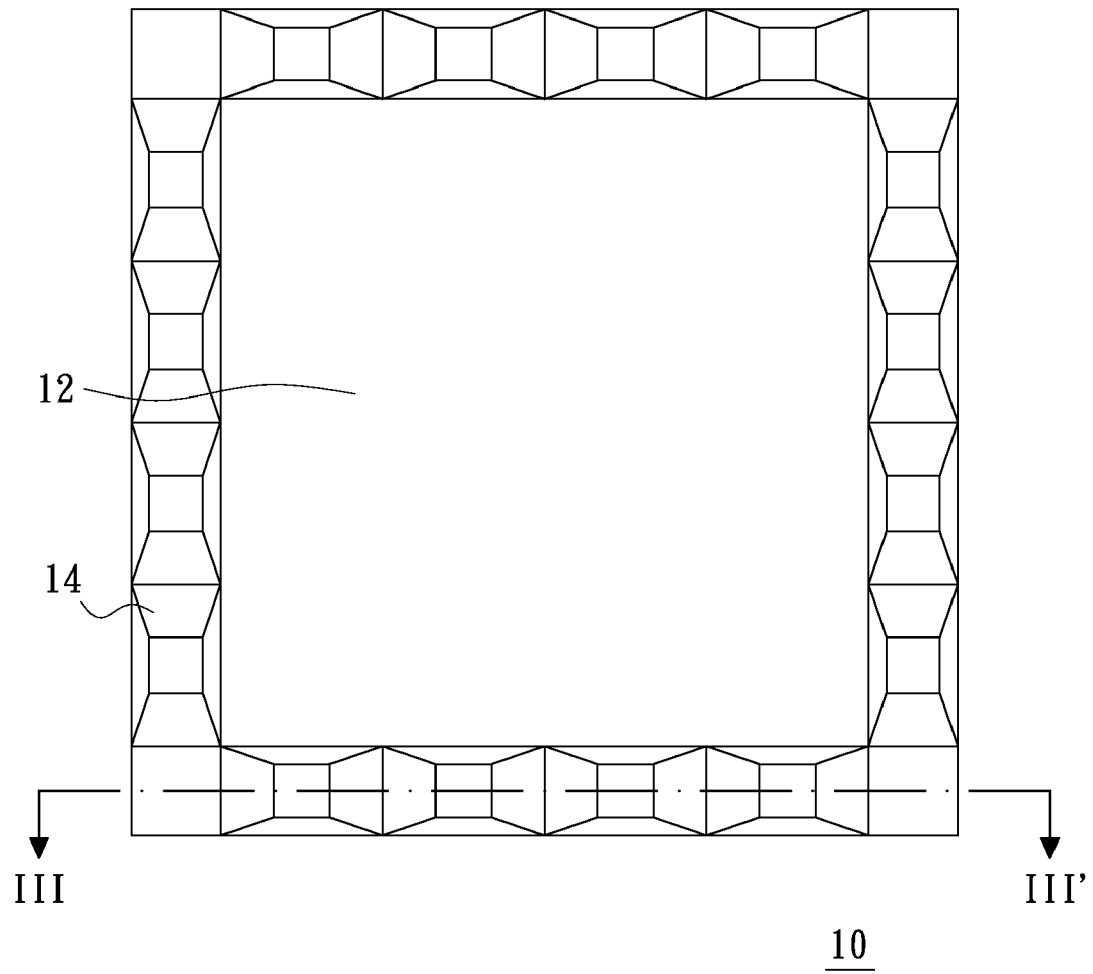
FIG. 1 is a schematic view of the flexible display device according to an embodiment of the invention.
Figure 2:
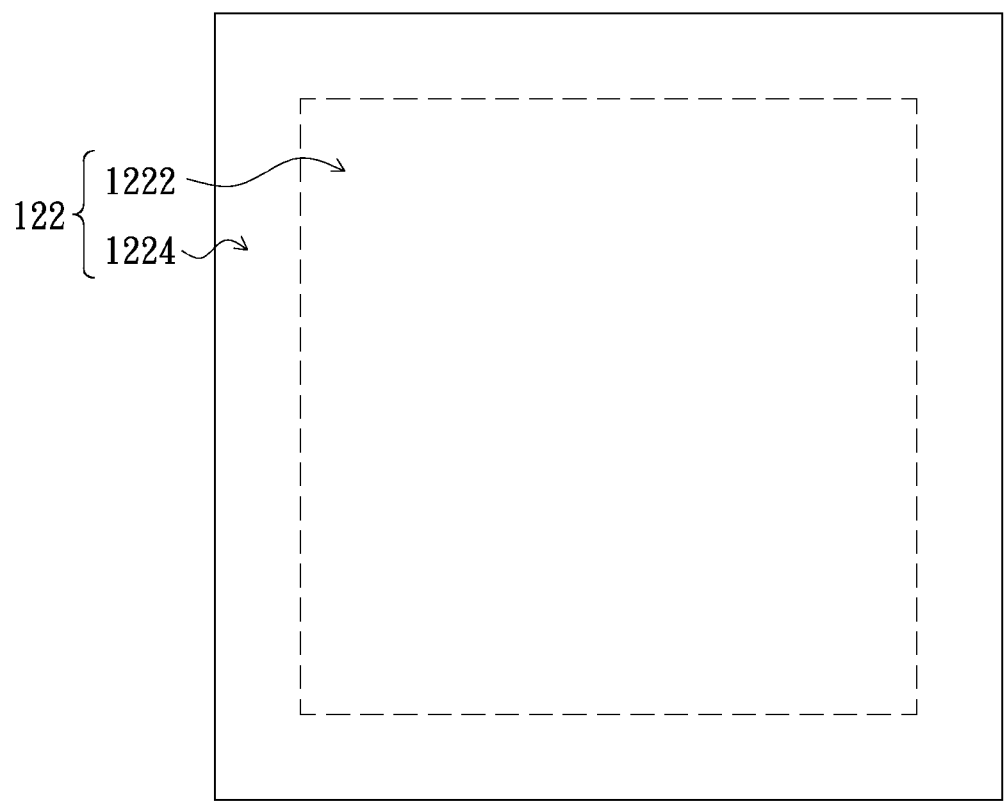
FIG. 2 is a schematic vertical view of the display panel of the flexible display device shown in FIG. 1.
Figure 3:
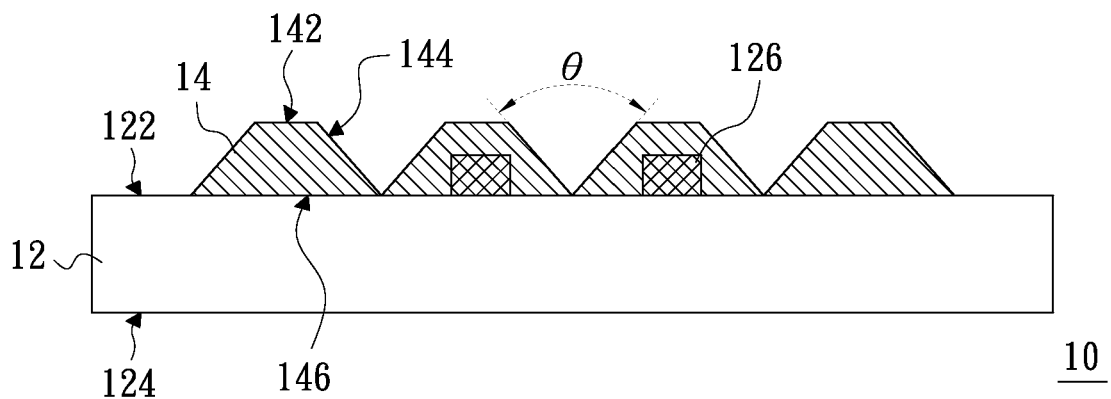
FIG. 3 is a schematic cross-sectional view along line III-III' of the flexible display device shown in FIG. 1.

FIG. 1 is a schematic view of the flexible display device according to an embodiment of the invention. FIG. 2 is a schematic view of the display panel of the flexible display device shown in FIG. 1. FIG. 3 is a schematic cross-sectional view along line III-III' of the flexible display device shown in FIG. 1. Referring to FIG. 1 to FIG. 3, the flexible display device 10 comprises a display panel 12 and a plurality of curving-restricting structures 14. The display panel 12 has a display surface 122 and a bottom surface 124 opposite thereto. The display surface 122 has a visible region 1222 and an outer region 1224 surrounding the visible region 1222. The curving-restricting structures 14 are disposed in the outer region 1224, and each curving-restricting structure 14 has a top surface 142 and at least a slanted side wall 144. The top surfaces 142 of adjacent curving-restricting structures 14 are separated to each other and the slanted side walls 144 thereof face to each other.

Specifically, the curving-restricting structures 14 may be taper and the cross areas thereof parallel the display surface 122 are growing smaller fromward the display surface 122. In this embodiment, each curving-restricting structure 14 is a trapezoid taper. However, the invention is not limited hereto. In other embodiments, the curving-restricting structures 14 may also be triangular tapers, cones or other polygonal tapers.

Additionally, the curving-restricting structures 14 of this embodiment may be formed integrally. That is, the bottoms 146 of the curving-restricting structures 14 are connected to each other in this embodiment. Furthermore, the curving-restricting structures 14 may be made of metal material, such as one of aluminum, magnesium and stainless steel or a compound including the aforementioned metal materials. Alternately, the curving-restricting structures 14 also may be made of plastic materials, such as one of acryl, acrylonitrilebutadiene-styrene (ABS) resin, silicone, polyurethane (PU) resin and epoxy resin or a compound including the aforementioned plastic materials.

Figure 4:
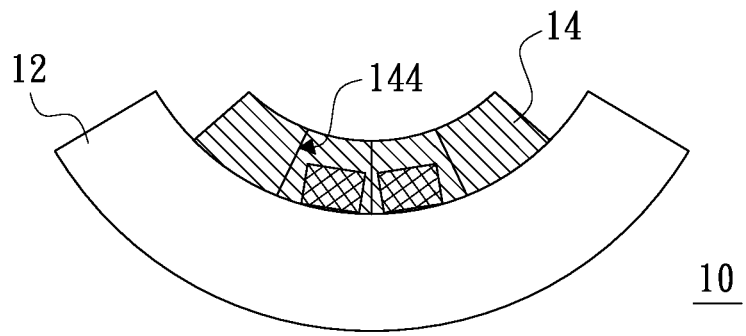
FIG. 4 is a schematic diagram illustrating the flexible display device shown in FIG. 1 is under bending.

The curving-restricting structures 14 are used for restricting the bending extent of the display panel 12. Referring to FIG. 3, there is an angle θ between the slanted side walls 144 of the adjacent curving-restricting structures 14, so the display panel 12 may be bent toward the display surface 122 within the permitted angle range. The value of the angle θ is determined based on the largest bending angle which the internal elements of the display panel 12 can bear. In detail, the adjacent curving-restricting structures 14 resist against with each other when the display panel 12 is bent toward the display surface to an angle, as shown in FIG. 4, so the display panel 12 cannot be further bent. The bending angle of the display panel 12 is the largest bending angle which the internal elements of the display panel 12 can bear.

Figure 5:
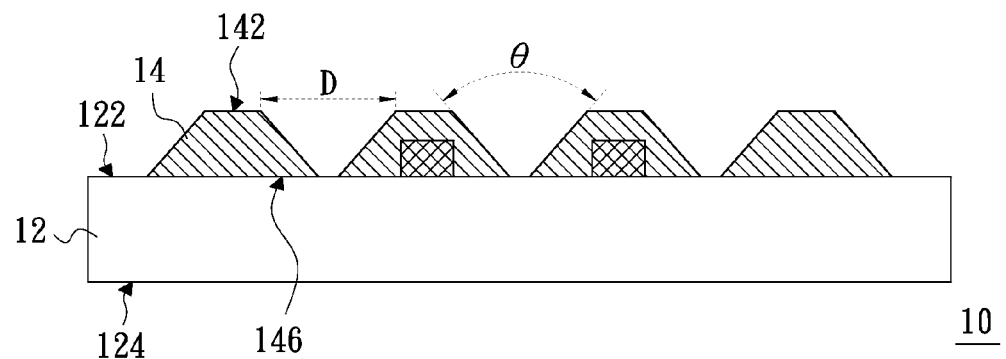
FIG. 5 is a schematic cross-sectional view of the flexible display device according to another embodiment of the invention.

Especially, the curving-restricting structures 14 may be formed respectively in another embodiment, and then disposed in the outer region 1224. The curving-restricting structures 14 may be arranged at intervals, as shown in FIG. 5. In this embodiment, the largest bending angle of the display panel 12 bent toward the display surface 122 relates to the distance D between the top surfaces 142 of adjacent curving-restricting structures 14 and to the angle θ. That is, the values of the distance D or of the angle θ are determined based on the largest bending angle which the internal elements of the display panel 12 can bear.

Moreover, the display panel 12 also comprises at least a driver chip 126, as shown in FIG. 3. Specifically, the curving-restricting structures 14 may be hollow and the driver chip 126 is covered thereby, so that the driver chip 126 may be protected from damage as the display panel 12 is bent. Alternately, the curving-restricting structures 14 also may be solid and the driver chip 126 is disposed in an area located between the outer region 1224 and the visible region 1222 and corresponded to the curving-restricting structures 14. Therefore, the curving-restricting structures 14 can protect the driver chip 126 from damage when the display panel 12 is bent as long as the driver chip 126 is not disposed between the adjacent curving-restricting structures 14.

Figure 6:
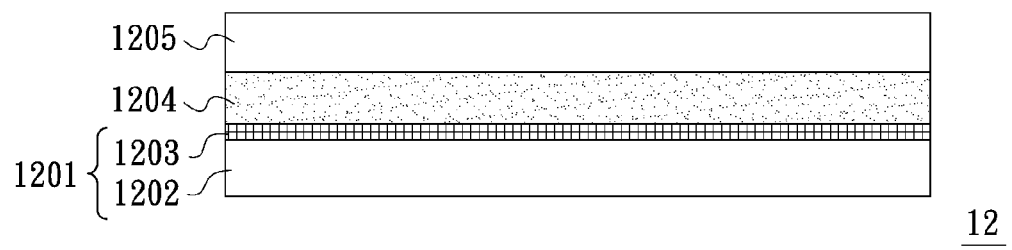
FIG. 6 is a schematic cross-sectional view of the display panel shown in FIG. 1.

Further, as shown in FIG. 6, the display panel 12 comprises an array substrate 1201, a display medium layer 1204 and a transparent layer 1205. The display medium layer 1204 may be liquid crystal layer, electro-phoretic layer, electro-wetting layer or organic electro-luminescence layer. The array substrate 1201 comprises a substrate 1202 and a switch elements array 1203 disposed thereon. The switch elements array 1203 may be an active elements array or a passive elements array. Specifically, the switch elements array 1203 of this embodiment is, for example, a thin film transistors array.

For the aforementioned flexible display device 10, since there are a plurality of curving-restricting structures 14 disposed in the outer region 1224 of the display panel 12, when the flexible display device 10 is bent toward the display surface 122 to a predetermined extent, the adjacent curving-restricting structures 14 resist against with each other to prevent the display panel 12 from damage due to over-bending. Therefore, the unusual displaying resulting from the over-bending of the flexible display device 10 may be avoided and the use reliability of the flexible display device 10 may be improved.

It should be noted that in other embodiments, the curving-restricting structures may disposed on the bottom surface of the display panel to restrict the bendable angle of the display panel at the other direction. The following embodiment will demonstrate that.

Figure 7:
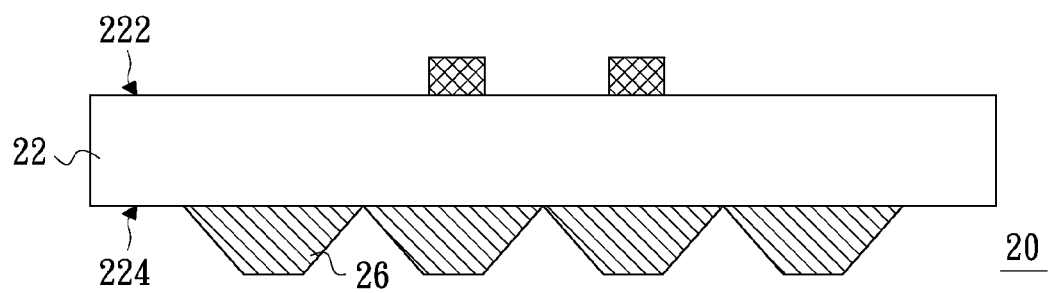
FIG. 7 is a schematic cross-sectional view of the flexible display device according to another embodiment of the invention.

FIG. 7 is a schematic cross-sectional view of the flexible display device according to another embodiment of the invention. Referring to FIG. 7, the flexible display device 20 is similar to the flexible display device 10, and the differences between them will be described in detail in the following paragraph.

For flexible display device 20, the curving-restricting structures 26 is disposed on the bottom surface 224 of the display panel 22 and corresponded to the outer region 1224 of the display surface 222. The curving-restricting structures 26 may be the same with or similar to the curving-restricting structures 14 of the flexible display device 10 and used for restrict the bending extent of the display panel 22.

As the aforementioned, the adjacent curving-restricting structures 26 resist against with each other to prevent the display panel 22 from damage due to over-bending when the display panel 22 is bent toward the bottom surface 224 to a predetermined extent. Therefore, the unusual displaying resulting from the over-bending of the flexible display device 20 may be avoided and the use reliability of the flexible display device 20 may be improved.

Figure 8:
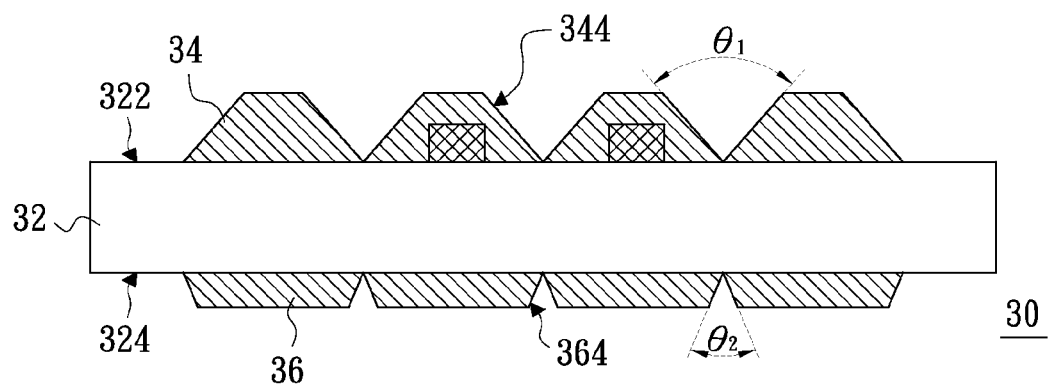
FIG. 8 is a schematic cross-sectional view of the flexible display device according to another embodiment of the invention.

Furthermore, the flexible display device of another embodiment of the invention, the curving-restricting structures are further disposed on the display surface and the bottom surface of the display panel at the same time. The following embodiment will demonstrate that. FIG. 8 is a schematic cross-sectional view of the flexible display device according to another embodiment of the invention. Referring to FIG. 8, the flexible display device 30 is similar to the flexible display device 10, and the differences between them will be described in detail in the following paragraph.

The flexible display device 30 comprises a plurality of curving-restricting structures 34 disposed in the outer region of the display surface 322 and a plurality of curving-restricting structures 36 disposed on the bottom surface 324 and corresponded to the curving-restricting structures 34. Thus, the bending angle of the display panel 32 at any direction may be restricted by the curving-restricting structures 34 and the curving-restricting structures 36. In detail, there is an angle $\theta_1$ between the slanted side walls 344 of adjacent curving-restricting structures 34, and there is an angle $\theta_2$ between the slanted side walls 364 of adjacent curving-restricting structures 36. The values of the angle $\theta_1$ and the angle $\theta_2$ are not limited hereto. Specially, the angle $\theta_1$ is larger than the angle $\theta_2$ in this embodiment. Therefore, the largest curvature of the flexible display device 30 bent toward the display surface 322 may larger than the largest curvature of the flexible display device 30 bent toward the bottom surface 324.

In summary, since there are a plurality of curving-restricting structures disposed on the display panel of the flexible display device of the invention, adjacent curving-restricting structures resist against with each other to prevent the display panel from damage due to over-bending when the flexible display device is bent to a predetermined extent. Therefore, the unusual displaying resulting from the over-bending of the flexible display device may be avoided and the use reliability of the flexible display device may be improved.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A flexible display device, comprising:
   a display panel has a display surface and a bottom surface opposite thereto, the display surface has a visible region and an outer region surrounding thereto, the display panel comprises a plurality of driver chips disposed in the outer region; and
   a plurality of first curving-restricting structures disposed in the outer region, wherein each first curving-restricting structure covering corresponding one of the driver chips has a first top surface and at least a first slanted side wall, the first top surface of the adjacent first curving-restricting structures are separated to each other and the first slanted side walls thereof face to each other.

2. The flexible display device as recited in claim 1, wherein the first curving-restricting structures are tapers.

3. The flexible display device as recited in claim 2, wherein the first curving-restricting structures are triangular tapers, cones or polygonal tapers.

4. The flexible display device as recited in claim 3, wherein the first curving-restricting structures are trapezoid tapers.

5. The flexible display device as recited in claim 2, wherein a plurality of cross areas of each first curving-restricting structures parallel the display surface are growing smaller fromward the display surface.

6. The flexible display device as recited in claim 1, wherein the first curving-restricting structures are formed integrally.

7. The flexible display device as recited in claim 1, further comprising a plurality of second curving-restricting structures respectively corresponding to one of the first curving-restricting structures and disposed on the bottom surface, each second curving-restricting structure has a second top surface and at least a second slanted side wall, the second top surface of the adjacent second curving-restricting structures are separated to each other and the second slanted side walls thereof face to each other.

8. The flexible display device as recited in claim 7, wherein the second curving-restricting structures are tapers.

9. The flexible display device as recited in claim 8, wherein the second curving-restricting structures are triangular tapers, cones or polygonal tapers.

10. The flexible display device as recited in claim 9, wherein the second curving-restricting structures are trapezoid tapers.

11. The flexible display device as recited in claim 8, wherein a plurality of cross areas of each second curving-restricting structures parallel the bottom surface are growing smaller fromward the bottom surface.

12. The flexible display device as recited in claim 7, wherein the second curving-restricting structures are formed integrally.

13. A flexible display device, comprising:
    a display panel has a display surface and a bottom surface opposite thereto, the display surface has a visible region and an outer region surrounding thereto, the display panel comprises a plurality of driver chips disposed in the outer region; and
    a plurality of curving-restricting structures disposed on the bottom surface and corresponded to the driver chips one on one, wherein each curving-restricting structure has a top surface and at least a slanted side wall, the top surface of the adjacent curving-restricting structures are separated to each other and the slanted side walls thereof face to each other.

14. The flexible display device as recited in claim 13, wherein the curving-restricting structures are tapers.

15. The flexible display device as recited in claim 14, wherein the curving-restricting structures are triangular tapers, cones or polygonal tapers.

16. The flexible display device as recited in claim 15, wherein the curving-restricting structures are trapezoid tapers.

17. The flexible display device as recited in claim 14, wherein a plurality of cross areas of each curving-restricting structures parallel the bottom surface are growing smaller fromward the bottom surface.

18. The flexible display device as recited in claim 13, wherein the curving-restricting structures are formed integrally.

* * * * *